(12) United States Patent
Iwawaki et al.

(10) Patent No.: US 7,687,154 B2
(45) Date of Patent: Mar. 30, 2010

(54) LIGHT-EMITTING DEVICE

(75) Inventors: Hironobu Iwawaki, Atsugi (JP); Shinjiro Okada, Isehara (JP); Takao Takiguchi, Chofu (JP); Satoshi Igawa, Fujisawa (JP); Masashi Hashimoto, Kawasaki (JP); Manabu Furugori, Machida (JP); Kengo Kishino, Yokohama (JP); Minako Kurokawa, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 15 days.

(21) Appl. No.: 11/131,352

(22) Filed: May 18, 2005

(65) Prior Publication Data
US 2005/0276994 A1    Dec. 15, 2005

(30) Foreign Application Priority Data
Jun. 15, 2004    (JP)    ............................. 2004-176557
Sep. 29, 2004    (JP)    ............................. 2004-283240

(51) Int. Cl.
*H01L 51/54*    (2006.01)
(52) U.S. Cl. ................ 428/690; 428/917; 313/504; 313/506; 257/102; 257/103
(58) Field of Classification Search ................ 428/690, 428/917; 313/504, 506
See application file for complete search history.

(56) References Cited

U.S. PATENT DOCUMENTS

| | | | |
|---|---|---|---|
| 5,536,949 A * | 7/1996 | Hosokawa et al. ............. 257/40 |
| 6,790,538 B2 * | 9/2004 | Naito .......................... 428/690 |
| 7,026,759 B2 * | 4/2006 | Mishima ...................... 313/512 |
| 7,070,867 B2 * | 7/2006 | Thompson et al. ........... 428/690 |
| 7,189,466 B2 | 3/2007 | Moriyama et al. ........... 428/690 |
| 2004/0241495 A1 * | 12/2004 | Kwong et al. ................ 428/690 |
| 2007/0184302 A1 * | 8/2007 | Iwawaki et al. .............. 428/690 |

FOREIGN PATENT DOCUMENTS

| | | | |
|---|---|---|---|
| EP | 1063869 | * | 12/2000 |
| JP | 2000-068057 | | 3/2000 |

(Continued)

OTHER PUBLICATIONS

Culligan et al., Adv. Materials, (2003), vol. 15, No. 14, p. 1176-1180.*

(Continued)

*Primary Examiner*—Dawn Garrett
(74) *Attorney, Agent, or Firm*—Fitzpatrick, Cella, Harper & Scinto (57) ABSTRACT

The present invention provides a light-emitting device which can be driven at a low voltage and has high luminance, high efficiency, and has a long lifetime even as an organic EL device using phosphorescence. The light-emitting device of the present invention is a light-emitting device including an anode, a cathode, and an organic light-emitting layer sandwiched between the anode and the cathode, in which the organic light-emitting layer is composed of a host material and one or more kinds of dopants, a difference in electron affinity between the host material and at least one kind of the dopants is 0.3 eV or less, and a difference in ionization potential between the host material and the at least one kind of the dopants is 0.8 eV or less.

5 Claims, 1 Drawing Sheet

FOREIGN PATENT DOCUMENTS

| | | |
|---|---|---|
| JP | 2002-299060 | 10/2002 |
| JP | 2003-007467 | 1/2003 |
| JP | 2003-55275 | 2/2003 |
| JP | 2004-014155 | 1/2004 |
| JP | 2004-164895 | 6/2004 |

OTHER PUBLICATIONS

Sudhakar et al, J. Am. Chem. Soc., (2003), vol. 125, p. 7796-7797.*

Hertel et al., Macromol. Symp., vol. 175, p. 141-150, (2001).*

Chen, et al.,; "Recent Developments in Molecular . . . Materials"; Macromol. Symp., vol. 125, pp. 1-48 (1997).

O'Brien, et al.; "Improved Energy Transfer . . . Devices"; Appl. Phys. Lett.; vol. 74, No. 3, pp. 442-444 (1999).

Baldo, et al.; "Very high-efficiency green organic . . . electrophosphorescence"; Appl. Phys. Lett., vol. 75, No. 1, pp. 4-6 (1999).

M. Sudhakar et al. "Phosphorescence Quenching by Conjugated Polymers" J. Am. Chem. Soc. 2003, vol. 125, pp. 7796-7797.

* cited by examiner

LIGHT-EMITTING DEVICE

BACKGROUND OF THE INVENTION

1. Field of the Invention

The present invention relates to a light-emitting device using an organic compound. More particularly, the present invention relates to an organic electroluminescent device (organic EL device).

2. Related Background Art

Figure 1A:
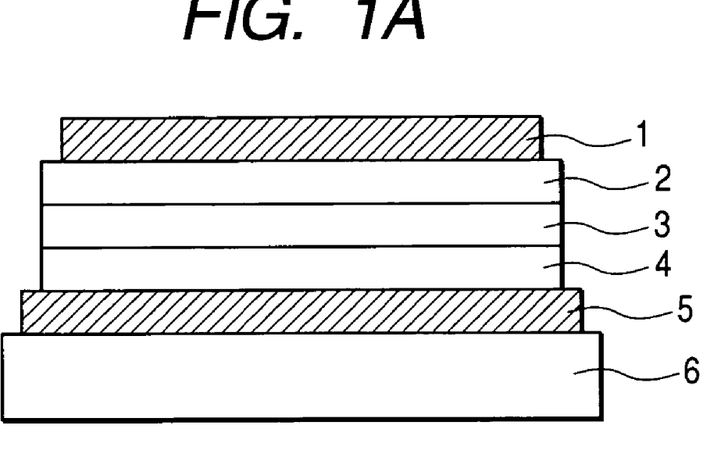
FIGS. 1A and 1B are schematic views each showing an example of a light-emitting device of the present invention.
Figure 1B:
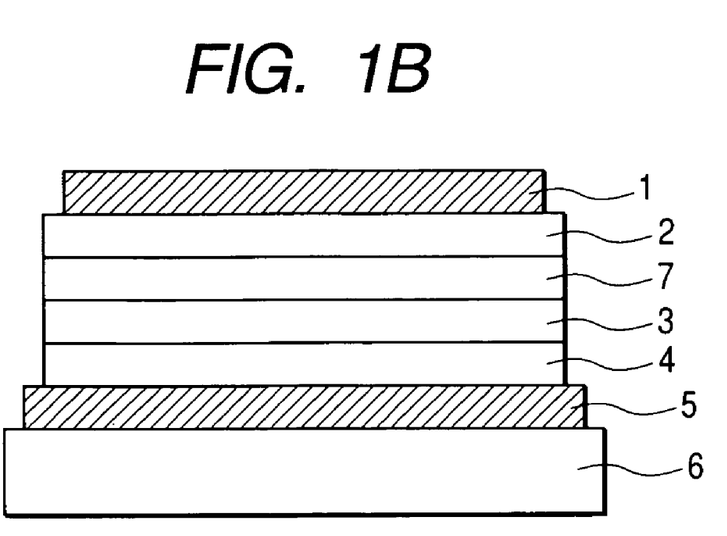

Applied research has been vigorously made on an organic EL device as a high-responsiveness and high-efficiency light-emitting device (Macromol. Symp. 125, 1 to 48 (1997)). FIGS. 1A and 1B each show the basic structure of the device. As shown in FIGS. 1A and 1B, the organic EL device is generally structured such that an organic multi-layer is sandwiched between a transparent electrode 5 on a transparent substrate 6 and a metal electrode 1.

In FIG. 1A, the organic layer is composed of an electron-transporting layer 2, a light-emitting layer 3, and a hole-transporting layer 4.

For example, ITO having a large work function is used for the transparent electrode 5 to provide good property of injecting a hole from the transparent electrode 5 to the hole-transporting layer 4. A metal material having a small work function such as aluminum, magnesium, or an alloy using any one of them is used for the metal electrode 1 to provide good property of injecting electrons to the organic layer. Those electrodes each have a thickness in the range of 50 to 200 nm.

For example, an aluminum-quinolinol complex (typified by $Alq_3$ shown below) having electron-transporting property and light-emitting property is used for the light-emitting layer 3. In addition, a material having electron-donating property such as a biphenyl diamine derivative (typified by α-NPD shown below) is used for the hole-transporting layer 4. An oxadiazole derivative or the like can be used for the electron-transporting layer 2.

Fluorescence upon transition of a singlet excitaton of a molecule as a light-emitting center to a ground state has been heretofore taken as light emission generally used in an organic EL device. Meanwhile, a device utilizing not fluorescent emission via a singlet excitaton but phosphorescence via a triplet excitaton has been under investigation ("Improved energy transfer in electrophosphorescent device" (D. F. O'Brien et al., Applied Physics Letters Vol 74, No 3, p 422 (1999) and "Very high-efficiency green organic light-emitting devices based on electrophosphorescence" (M. A. Baldo et al., Applied Physics Letters Vol 75, No 1, p 4 (1999)). In each of those documents, a four-layered structure composed of organic layers shown in FIG. 1B is mainly used. The four-layered structure is composed of a hole-transporting layer 4, a light-emitting layer 3, an excitaton diffusion preventing layer 7, and an electron-transporting layer 2 from the side of an anode. The materials used are the following carrier-transporting materials and phosphorescent materials. Abbreviations of the respective materials are as follows.

$Alq_3$: aluminum-quinolinol complex

α-NPD: N4,N4'-Di-naphthalen-1-yl-N4,N4'-diphenyl-biphenyl-4,4'-diamine

CBP: 4,4'-N,N'-dicarbazole-biphenyl

BCP: 2,9-dimethyl-4,7-diphenyl-1,10-phenanthroline

PtOEP: platinum-octaethylporphyrin complex

Ir(ppy)$_3$: iridium-phenylpyridine complex

High efficiency was obtained in each of "Improved energy transfer in electrophosphorescent device" (D. F. O'Brien et al, Applied Physics Letters Vol 74, No 3, p 422 (1999) and "Very high-efficiency green organic light-emitting devices based on electrophosphorescence" (M. A. Baldo et al, Applied Physics Letters Vol 75, No 1, p 4 (1999)) because α-NPD was used for the hole-transporting layer 4, $Alq_3$ was used for the electron-transporting layer 2, BCP was used for the excitaton diffusion preventing layer 7, and CBP as a host material mixed with PtOEP or Ir(ppy)$_3$ as a phosphorescent material at a concentration of about 6% was used for the light-emitting layer 3.

A phosphorescent material has been attracting considerable attention because it is expected to provide high luminous efficiency on principle. The reason for this is that excitatons generated by carrier recombination are composed of singlet excitatons and triplet excitatons, and the ratio between the number of singlet excitatons and the number of triplet excitatons is 1:3. An organic EL device utilizing a singlet has taken fluorescence upon transition from a singlet excitaton to a ground state as light emission. However, on principle, the luminescence yield of the device was 25% of the number of generated excitatons, and the value was an upper limit on principle. When phosphorescence from an excitaton generated from a triplet is used, an yield at least 3 times as high as that of the above yield is expected on principle. Furthermore, when transfer due to intersystem crossing from a singlet at a higher energy level to a triplet at a lower energy level is taken into consideration, a luminescence yield 4 times as high as the above yield, that is, a luminescence yield of 100% is expected.

In addition, the development of a host material using a phosphorescent metal coordination compound as a dopant has been actively made (Japanese Patent Application Laid-Open No. 2003-55275). However, when $Ir(ppy)_3$ described in it is used as a dopant, a threshold voltage is high and a current is hard to flow, so the host material is susceptible to improvement.

In the above-described organic EL device using phosphorescence, injection of an increased number of carriers to the light-emitting layer at a low voltage while maintaining a balance between an electron and a hole at a low voltage is important for the achievement of high luminance and high efficiency. However, some of the above phosphorescent materials have low charge-injecting/transporting properties and are hard to allow a large amount of current to flow at a low voltage.

SUMMARY OF THE INVENTION

An object of the present invention is to provide a light-emitting device which can be driven at a low voltage, and has high luminance, high efficiency and a long lifetime even as an organic EL device using phosphorescence.

The inventors of the present invention have made extensive studies to achieve the above object, thereby accomplishing the present invention.

That is, according to one aspect of the present invention, there is provided a light-emitting device including an anode, a cathode, and an organic light-emitting layer sandwiched between the anode and the cathode, wherein the organic light-emitting layer is composed of a host material and one or more kinds of dopants, a difference in electron affinity between the host material and at least one kind of the dopants is 0.3 eV or less, and a difference in ionization potential between the host material and the at least one kind of the dopants is 0.8 eV or less.

According to another aspect of the present invention, there is provided a light-emitting device including, an anode, a cathode, and an organic light-emitting layer sandwiched between the anode and the cathode, wherein the organic light-emitting layer is composed of a host material and one or more kinds of dopants, wherein at least one kind of the dopants is a phosphorescent compound, and wherein the host material is a linear aromatic compound having a single molecular weight and no aromatic side substituent, a minimum excitation triplet energy of the linear aromatic compound in an amorphous film being higher than a minimum excitation triplet energy of the phosphorescent compound.

According to the present invention, there can be provided an organic electroluminescent device which can be driven at a low voltage, which provides high luminance and high efficiency, and which has a long lifetime.

DESCRIPTION OF THE PREFERRED EMBODIMENTS

The light-emitting device of the present invention is a light-emitting device including an anode, a cathode, and an organic light-emitting layer sandwiched between the anode and the cathode. The layer structure of the light-emitting device is not particularly limited, and examples of the structure include structures shown in FIGS. 1A and 1B. Furthermore, a method of producing the layer structure is not limited to vacuum evaporation, and a wet coating method may be used which is typified in coating methods.

The light-emitting device of the present invention has an organic light-emitting layer composed of a host material and one or more kinds of dopants to be incorporated into the host material, the dopant being preferably a phosphorescent compound, or more preferably any one of the following iridium complexes.

Ir(piq)₃

Ir(bq)₃

Ir(4mopiq)₃

Ir(4mpiq)₃

Ir(C2piq)₃

Ir(tBupiq)₃

Ir(phpiq)₃

The concentration of light-emitting molecules may be reduced to suppress concentration quenching which generally causes a reduction in luminous efficiency. In this case, no current flows, thereby reducing energy efficiency. The iridium complexes shown above each have a spherical structure and have low association property as compared to that of a complex having a flat structure such as a platinum-octathienylporphyrin complex, and hence are useful in suppressing concentration quenching. In such iridium complexes, a complex having a substituent in its ligand structure has a small interaction between molecules and often has reduced current conductivity (thereby causing, for example, hopping barrier of carriers between molecules). However, owing to the small interaction between molecules, the complex can suppress an intermolecular quenching mechanism including concentration quenching. Therefore, providing a light-emitting molecule with a substituent is effective in light emission. However, the complex requires an increased driving voltage, thereby causing a problem in that a device lifetime is short.

As described above, in the case where a phosphorescent metal coordination compound having a substituent by which a current is hard to flow is used, a reduction in voltage of a light-emitting device has been difficult. However, an additional reduction in voltage can be achieved by mixing such a light-emitting material incapable of reducing the voltage of the device with a light-emitting material having no substituent. Furthermore, the inventors of the present invention have found, as a method of significantly reducing the voltage of the device, that a threshold voltage can be reduced and hence a driving voltage at a predetermined luminance can be reduced by using a host material and a dopant having a difference in ionization potential between the host material and the dopant equal to or smaller than 0.3 eV and a difference in electron affinity between them equal to or smaller than 0.8 eV. In this case, charge injected from both electrodes is injected to the light-emitting layer. During the charges propagate in the light-emitting layer, the dope concentration is several percent even when the light-emitting dopant itself serves as a charge carrier, so that a large part of charges propagates across the host material. For example, in the case of an electron, when the electron affinity of the host material is excessively different from that of the dopant, the electron hardly moves from the host material to the dopant, and recombination on the host or the dropout of the electron to the hole-transporting layer may occur. As a result, a probability of recombination on the dopant reduces, thereby reducing current efficiency.

Here, the light-emitting layer may be doped with one or more kinds of dopants. In this case, the inventors of the present invention have found that a threshold voltage can be reduced and hence a voltage can be reduced at predetermined luminance when a difference in electron affinity $\Delta E1$ between the host material and at least one of the one or more kinds of the dopants is 0.3 eV or less and a difference in ionization potential $\Delta E2$ between the host material and the at least one of the one or more kinds of dopants is 0.8 eV or less. In addition, the reduction in voltage may lead to a reduction in electric field intensity of the light-emitting layer, and a lengthened lifetime. This is probably because when the ionization potential and electron affinity of the host material are adjusted to those of the dopant serving as a trap in the light-emitting layer, the charge can be easily trapped by the dopant.

The ionization potential in the present invention is directly determined by measuring a thin film deposited on a substrate by means of photoelectron spectroscopy. In addition, a band gap [BG] is a value determined by substituting a value ($\lambda$nm) obtained from an absorption edge of an absorption spectrum of a dilute solution dissolved into an organic solvent into a conversion equation shown in (Equation 1).

$$[BG]=1243/\lambda \quad \text{(Equation 1)}$$

In addition, the electron affinity [Ea] can be determined in accordance with (Eq. 2) from the ionization potential [Ip] determined by the above measurement method and the band gap determined from (Equation 1).

$$[Ea]=[Ip]-[BG] \quad \text{(Equation 2)}$$

In addition, the ionization potential and HOMO's energy level have the same meaning, while the electron affinity and LUMO's energy level have the same meaning.

Furthermore, the charges injected to the light-emitting layer may show two types of recombinations: recombination on the dopant and recombination on the host. In general, the two processes may occur in the light-emitting layer at a certain ratio. Finally, in order to take the light emission of the dopant, the charges are ideally recombined on the dopant at 100%, or, even when the recombination occurs on the host, smooth energy movement to the dopant is desirably caused. Here, Förster type energy transfer is one possible choice for the process of energy movement. In this case, the light emission of the host and the absorption of the dopant must overlap. Therefore, even if the dopant is in a cation state or anion state and is hence extremely unstable, recombination occurs on the host to cause the dopant to show Förster type or Dexter type energy movement. As a result, the dopant can be allowed to stably emit light for a long period of time.

Furthermore, the inventors of the present invention have found that when a linear aromatic compound having no aromatic side substituent is used as a host, particularly in the case where an iridium complex having in its molecular structure a substituent suppressing an intermolecular quenching mechanism including concentration quenching is used as a dopant in a light-emitting layer, a device lifetime is considerably improved. The device lifetime can be further improved when the atoms constituting a host molecule are only carbon atoms and hydrogen atoms. The reason for this is probably as follows. A molecule having a hetero atom in it has a larger dipole moment per molecule than that of a molecule composed of only carbon atoms and hydrogen atoms owing to a difference in electronegativity between a carbon atom and the hetero atom. As a result, after injecting to a light-emitting layer charges injected and propagated from both electrodes, the molecule having a hetero atom acts to prevent the movement of the charge, thereby reducing conductivity. In addition, in the case where an organic light-emitting layer is formed by means of vacuum evaporation or the like, a molecule having a larger dipole moment has large polarity and easily takes in a polar molecule that may prevent charge movement. As a result, the impurity concentration in a light-emitting device increases, and the increase may become a cause for a reduction in device lifetime.

The term "linear aromatic compound having a single molecular weight and no aromatic side substituent" refers to a compound in which aromatic rings are linearly bound, which has no aromatic substituent in a direction different from a molecular major-axis direction, and which does not have any condensed ring structure such as a carbazole ring, an anthracene ring, or a fluorene ring in a direction different from the molecular major-axis direction. Examples of such a compound include fluorene polymers each having no aromatic substituent in any one of positions 1, 3, 4, 5, 6, and 8 (except for positions 2 and 7) of a fluorene ring in a molecular major-axis direction such as Compounds 1 to 4 shown below. The linear aromatic compound is preferably a compound having a molecular major axis composed of a phenyl ring, a fluorene ring, a naphthalene ring, or a combination of those rings.

The linear aromatic compound to be used in the present invention has a single molecular weight, so that similarly to a polymeric linear aromatic compound composed of carbon and hydrogen typified by polyfluorene, there is no difficulty in removing impurities and hence the compound to be used in the present invention is advantageous in terms of the initial efficiency and lifetime of a light-emitting device.

In particular, in the case where a red light-emitting material having a light-emitting wavelength around 600 nm is used as a dopant, the host material is desirably a fluorene oligomer of a trimer or more, or preferably a trimer or more and a pentamer or less. A fluorene oligomer of a trimer or more hardly crystallizes and is stable at the time of evaporation.

In addition, the host material preferably has a glass transition point (Tg) equal to or higher than 120° C. Among the linear aromatic compounds having a single molecular weight and no aromatic side substituent, a compound having a molecular major axis composed of only fluorene rings, is excellent in amorphous property and is capable of realizing a high glass transition point (Tg) equal to or higher than 120° C. Furthermore, introduction of a bulky substituent into a molecular major-axis direction can realize an additionally high glass transition point (Tg).

Specific examples of the linear aromatic compound having a single molecular weight and no aromatic side substituent are shown below. However, the present invention is not limited to these examples.

Compound 1

Compound 2

Compound 3

Compound 4

The high-efficiency light-emitting device of the present invention can be applied to a product requiring energy savings and high luminance. Potential applications of the light-emitting device include: light sources for a display apparatus, a lighting system, and a printer; and a backlight for a liquid crystal display apparatus. A flat panel display having energy savings, high visibility, and lightweight can be achieved when the device of the present invention is applied to a display apparatus. In the case of a light source for a printer, a laser light source portion of a laser beam printer currently in active use can be replaced with the light-emitting device of the present invention. Devices that can be independently addressed are arranged on an array, and desired exposure is carried out on a photosensitive drum, whereby an image is formed. The use of the device of the present invention significantly reduces an apparatus volume. An energy saving effect of the present invention is expected to be shown in a lighting system or a backlight.

A common part of device production steps used in the present examples will be described.

In the present examples, a light-emitting device having three organic layers shown in FIG. 1A was used as a device structure.

ITO (as the transparent electrode 5) having a thickness of 100 nm was patterned on a glass substrate (as the transparent substrate 6) to have an opposing electrode area of 3 $mm^2$. The following organic layers and electrode layers were continuously vacuum-deposited on the ITO substrate in a vacuum chamber at $10^{-5}$ Pa by resistance heating.

Hole-transporting layer 4 (20 nm): FL03

Light-emitting layer 3 (50 nm): host material+dopant

Electron-transporting layer 2 (30 nm): Bphen

Metal electrode layer 1 (1 nm): KF

Metal electrode layer 1 (100 nm): Al

FL03

-continued

TAZ

Bphen

Table 1 summarizes the electron affinity (Ea), ionization potential (Ip), and glass transition point (Tg) of each of the materials used in Examples and Comparative Examples.

TABLE 1

|  | Ea(eV) | Ip(eV) | Tg(° C.) |
|---|---|---|---|
| Ir(bq)$_3$ | 2.67 | 5.04 | — |
| Ir(4mopiq)$_3$ | 2.98 | 5.15 | — |
| Ir(piq)$_3$ | 2.86 | 5.03 | — |
| Compound 1 | 2.72 | 5.77 | 155 |
| Compound 2 | 2.74 | 5.75 | 138 |
| Compound 3 | 2.62 | 5.87 | 128 |
| CBP | 2.5 | 5.9 | 115 |
| TCTA | 2.26 | 5.65 | 151 |
| Compound 5 | 2.33 | 5.72 | — |

The ionization potential was measured by using a VG Scientific ESCA Lab manufactured by Scientific Instrument Services Corporation in a vacuum of $1 \times 10^{-7}$ Pa. The BG was measured by means of a UV-3100S manufactured by Shimadzu Corporation by dissolving a material into a toluene solution to have a concentration of $1 \times 10^{-5}$ mol/l. The Tg was measured by using a DSC 3100S manufactured by Mac Science Corporation.

Comparison between the minimum excitation triplet energy level of each of the host materials of Examples 1 to 5 and Comparative Examples 1 to 4 in an amorphous film and the minimum excitation triplet energy level of the corresponding dopant showed that the minimum excitation triplet energy level of the host material was larger than that of the dopant. A method of measuring a minimum excitation triplet energy level is as follows. A material was vacuum-deposited on a glass substrate to have a thickness of 200 nm, and it was cooled to the liquid nitrogen temperature, and a light-emitting wavelength peak of a light-emitting component of 1 ms or longer in photoexcitation was read as the excitation triplet energy in a thin amorphous film state. Measurement was performed by using Ir(ppy)$_3$ as a sensitizer when no light-emission was observed.

Examples 1 to 3 and Comparative Example 1

The host material and dopant shown in Table 2 were used for the light-emitting layer 3. The dopant concentration was 8 wt % for Ir(bq)$_3$, and 4 wt % for Ir(4mopiq)$_3$.

In Table 2, ΔE1 indicates a difference in electron affinity between a host material and a dopant, and ΔE2 indicates a difference in ionization potential between the host material and the dopant. The values shown in Table 1 were used as actually measured values. In addition, the evaluation was performed such that the case where both relationships of ΔE1≦0.3 eV and ΔE2≦0.8 eV were satisfied was designated as "○", while the case where either of the relationships was not satisfied was designated as "x".

Table 3 shows the efficiency (lm/W at 600 cd/m$^2$), luminance half hour (hr) when driven at a constant current (100 mA/cm$^2$), threshold voltage (voltage at 0.1 mA/cm$^2$), and evaluation of each of those devices. A spectrum confirmed that main light emission was red light emission at λmax=610 nm caused by Ir(4mopiq)$_3$.

In the evaluation shown in Table 3, an efficiency of 10.0 lm/W or more was designated as "○". A threshold voltage of 3.0 V or lower was designated as "○" and a threshold voltage in excess of 3.0 V was designated as "x" because a low voltage is preferable to delay the consumption of a battery in the case of driving at a constant current. With regard to the lifetime, a luminance half hour in terms of 600 cd/m$^2$ of 20,000 hours or longer was designated as "○" and a luminance half hour in terms of 600 cd/m$^2$ shorter than 20,000 hours was designated as "x" because the above luminance half hour was a value in a current acceleration test.

Table 3 shows that a high efficiency of 10.0 lm/W or more was obtained in each of Examples 1 to 3 and Comparative Example 1. The lifetime was 25,000 hr or more in each of Examples 1 to 3 in an actual luminance region to be used, while the lifetime was 14,000 hr in Comparative Example 1. The threshold voltage of Comparative Example 1 showed a value higher than the threshold voltage of each of Examples 1 to 3 by 0.5 to 0.6 V.

That is, it can be understood that, in each of Examples 1 to 3 where all of the efficiency, the lifetime, and the threshold voltage are satisfied, at least Ir(bq)$_3$ satisfies both ΔE1 and ΔE2. In addition, the host materials of Examples 1 to 3 are composed of only carbon atoms and hydrogen atoms, while the host material (CBP) shown in Comparative Example 1 contains a hetero atom in its molecular structure.

TABLE 2

| | Host | Dopant | ΔE1(eV) | ΔE2(eV) | Evaluation |
|---|---|---|---|---|---|
| Example 1 | Compound 1 | Ir(bq)₃ | 0.05 | 0.73 | ○ |
| | | Ir(4mopiq)₃ | 0.26 | 0.62 | ○ |
| Example 2 | Compound 2 | Ir(bq)₃ | 0.07 | 0.71 | ○ |
| | | Ir(4mopiq)₃ | 0.24 | 0.6 | ○ |
| Example 3 | Compound 3 | Ir(bq)₃ | 0.08 | 0.8 | ○ |
| | | Ir(4mopiq)₃ | 0.39 | 0.69 | x |
| Comparative Example 1 | CBP | Ir(bq)₃ | 0.17 | 0.86 | x |
| | | Ir(4mopiq)₃ | 0.48 | 0.75 | x |

TABLE 3

| | Efficiency | | Lifetime | | Threshold voltage | |
|---|---|---|---|---|---|---|
| | lm/W | Evaluation | Luminance half hour | Evaluation | Vth (0.1 mA/cm2) | Evaluation |
| Example 1 | 12.4 | ○ | 269 | ○ | 2.6 | ○ |
| Example 2 | 14.0 | ○ | 265 | ○ | 2.5 | ○ |
| Example 3 | 13.0 | ○ | 270 | ○ | 2.6 | ○ |
| Comparative Example 1 | 12.2 | ○ | 113 | x | 3.0 | x |

It was found that the light emission of an assist compound can be suppressed by bringing the minimum excitation triplet energy level of a host compound in a thin amorphous film state close to the minimum excitation triplet energy level of the assist compound. Here, the assist compound indicates a compound having a minimum excitation triplet energy higher than that of a dopant which is a main part for light emission and a dope concentration smaller than that of a host compound.

The minimum excitation triplet energy level of Ir(bq)₃ used in the present examples is 2.12 eV. However, when Compound 1 is used as a host, a luminescent chromaticity of (0.65, 0.35) is obtained. When Compound 3 is used as a host, a luminescent chromaticity of (0.64, 0.36) is obtained, and the luminescent color is orange mixed with the luminescent color of Ir(bq)₃. In this case, the minimum excitation triplet energy level of Compound 1 in a thin amorphous film state was 2.17 eV, while the minimum excitation triplet energy level of Compound 3 in a thin amorphous film state was 2.27 eV. This revealed that a difference between the minimum excitation triplet energy level of a host compound in a thin film state and the minimum excitation triplet energy level of an assist compound is desirably equal to or smaller than 0.05 eV in order to maintain chromaticity at a satisfactory level.

The minimum excitation triplet energy levels of Compound 1 and Compound 3 in solution states were 2.98 eV and 3.18 eV, respectively. Therefore, it can be understood that the minimum excitation triplet energy level in a thin amorphous film state is more important than that in a solution state.

In each of Examples 1 to 3, a difference between the minimum excitation triplet energy level of a host material in an amorphous film and the minimum excitation triplet energy level of Ir(4mopiq)₃ was equal to or smaller than 0.2 eV, while, in Comparative Example 1, the difference was equal to or larger than 0.2 eV. If the energy level difference is large, energy movement from a host to a dopant may hardly occur.

Example 4 and Comparative Examples 2 and 3

The host material and dopant shown in Table 4 were used for the light-emitting layer 3. The dopant concentration was set to 10 wt %. The structures of Compound 5 and TCTA used as host materials are shown below.

TCTA

Compound 5

Table 5 shows the efficiency (lm/W at 600 cd/m²), luminance half hour (hr) when driven at a constant current (100 mA/cm²), threshold voltage (voltage at 0.1 mA/cm²), and evaluation of each of those devices. A spectrum confirmed that light emission was red light emission at λmax=625 nm caused by Ir(piq)₃.

In the evaluation shown in Table 5, an efficiency of 5.0 lm/W or more was designated as "○". This is because a luminescence emission spectrum has a long wavelength (λmax=625 nm) as compared to the dopants of Examples 1 to 3, so luminous efficiency is reduced. The other part of Table 4 is the same as that of Table 3.

The host material (TCTA) of Comparative Example 2 is a non-linear aromatic compound as its molecular structure and the host material (Compound 5) of Comparative Example 3 has a molecular structure which contains no hetero atom, and which is not linear but is spread in a planar fashion.

TABLE 4

|  | Host | Dopant | ΔE1(eV) | ΔE2(eV) | Evaluation |
|---|---|---|---|---|---|
| Example 4 | Compound 1 | Ir(piq)$_3$ | 0.14 | 0.74 | ○ |
| Comparative Example 2 | TCTA | Ir(piq)$_3$ | 0.6 | 0.62 | x |
| Comparative Example 3 | Compound 5 | Ir(piq)$_3$ | 0.53 | 0.69 | x |

TABLE 5

|  | Efficiency | | Lifetime | | Threshold voltage | |
|---|---|---|---|---|---|---|
|  | lm/W | Evaluation | Luminance half hour | Evaluation | Vth (0.1 mA/cm$^2$) | Evaluation |
| Example 4 | 5.5 | ○ | 1500 | ○ | 2.9 | ○ |
| Comparative Example 2 | 4.0 | x | 10 | x | 3.9 | x |
| Comparative Example 3 | 2.2 | x | 100 | x | 3.5 | x |

As described above, the device of the present invention containing one or more kinds of dopants satisfying ΔE1≦0.3 eV and ΔE2≦0.8 eV at the same time is found to satisfy all of the three items: high efficiency, long lifetime, and low threshold voltage.

In Example 4, a difference between the minimum excitation triplet energy level of the host material in an amorphous film and the minimum excitation triplet energy level of Ir(piq)$_3$ was equal to or smaller than 0.2 eV, while, in each of Comparative Examples 2 and 3, the difference was equal to or larger than 0.2 eV.

Example 5 and Comparative Example 4

An iridium complex containing a substituent such as a methoxy group inevitably required an extremely high driving voltage in a light-emitting device using CBP as a host. The reason for this is not clear, but the inventors have found that a driving voltage can be reduced by using, as a host compound, a linear aromatic compound having a single molecular weight and no aromatic side substituent.

The host material and dopant shown in Table 6 were used for the light-emitting layer 3. The dopant concentration was set to 10 wt %.

Table 7 shows the efficiency (lm/W at 600 cd/m$^2$), luminance half hour (hr) when driven at a constant current (100 mA/cm$^2$), threshold voltage (voltage at 0.1 mA/cm$^2$), and evaluation of each of those devices. A spectrum confirmed that light emission was red light emission at λmax=610 nm caused by Ir(4mopiq)$_3$.

TABLE 6

|  | Host | Dopant | ΔE1(eV) | ΔE2(eV) | Evaluation |
|---|---|---|---|---|---|
| Example 5 | Compound 1 | Ir(4mopiq)$_3$ | 0.26 | 0.62 | ○ |
| Comparative Example 4 | CBP | Ir(4mopiq)$_3$ | 0.48 | 0.75 | x |

TABLE 7

|  | Efficiency lm/W | Lifetime Luminance half hour (hr) | Threshold voltage Vth (0.1 mA/cm$^2$) |
|---|---|---|---|
| Example 5 | 10.4 | 50 | 2.8 |
| Comparative Example 4 | 8.5 | 5 | 3.5 |

As described above, a light-emitting device obtained by doping a linear aromatic compound having a single molecular weight and no aromatic side substituent with an iridium complex containing a substituent was confirmed to have a low threshold voltage and an extremely improved device lifetime as compared with a light-emitting device using a compound containing a hetero atom as a host.

In Example 5, a difference between the minimum excitation triplet energy level of the host material in an amorphous film and the minimum excitation triplet energy level of Ir(4mopiq)$_3$ was equal to or smaller than 0.2 eV, while, in Comparative Example 4, the difference was equal to or larger than 0.2 eV.

This application claims priority from Japanese Patent Application Nos. 2004-176557 filed on Jun. 15, 2004 and 2004-283240 filed on Sep. 29, 2004, which are hereby incorporated by reference herein.

What is claimed is:
1. A light-emitting device, comprising:
an anode, a cathode, and an organic light-emitting layer sandwiched between the anode and the cathode,
wherein the organic light-emitting layer comprises a host material and a phosphorescent dopant, the host material is a compound represented by the following formula:

wherein n is an integer of 1, 2 or 3,
wherein the phosphorescent dopant is a compound selected from the group consisting of the following formulas:

2. A light-emitting device according to claim 1, wherein the phosphorescent dopant is a compound which emits a light having a peak of luminous spectrum of around 600 nm to 625 nm.

3. A light-emitting device according to claim 1, wherein a difference in energy between a minimum excitation triplet energy level of the host material and a minimum excitation triplet energy level of the phosphorescent dopant is 0.2 eV or less.

4. A display apparatus comprising a light-emitting device according to claim 1.

5. The light-emitting device according to claim 1, wherein the phosphorescent dopant is a compound represented by the following formula: